United States Patent [19]
Ammon et al.

[11] Patent Number: 5,544,969
[45] Date of Patent: Aug. 13, 1996

[54] STACKED ENCLOSURE LOCKING MECHANISM

[75] Inventors: James G. Ammon; John C. Nuttall, both of San Jose, Calif.

[73] Assignee: Sun Microsystems, Inc., Mountain View, Calif.

[21] Appl. No.: 288,464

[22] Filed: Aug. 10, 1994

[51] Int. Cl.⁶ .......................... H05K 5/00; B65D 21/036
[52] U.S. Cl. .......................... 403/322; 361/744; 220/23.4; 220/23.6
[58] Field of Search ...................... 361/724, 725, 361/726, 732, 735, 744; 174/52.1; 220/23.4, 23.83, 23.6, 1.5; 206/509, 511; 403/322, 321

[56] References Cited

U.S. PATENT DOCUMENTS

| | | | |
|---|---|---|---|
| 4,287,997 | 9/1981 | Rolfe et al. | 220/23.6 X |
| 4,632,594 | 12/1986 | Del Tufo et al. | 220/23.4 X |
| 4,648,737 | 3/1987 | Lake, Jr. et al. | 361/732 X |
| 4,748,540 | 5/1988 | Henneberg et al. | 361/724 X |
| 5,157,585 | 10/1992 | Myers | 361/724 X |
| 5,251,106 | 10/1993 | Hui | 361/744 |

*Primary Examiner*—Anthony Knight
*Attorney, Agent, or Firm*—Julian Caplan, Esq. Flehr, Hohbach, Test, Albritton & Herbert

[57] ABSTRACT

A module is sandwiched between an underlying member and a superimposed enclosure. The underlying member may be a base or another enclosure. The module is constructed so that it can be secured to the underlying member. The superimposed member has feet formed with horizontal grooves which fit into pockets in corners of the module. A slide is horizontally movable in the module between retracted position and an operative position. In the operative position edges of the slide engage in the grooves in the feet to lock the superimposed enclosure to the module and thereby to the underlying member. The slide may be detachably secured in operative position.

28 Claims, 4 Drawing Sheets

STACKED ENCLOSURE LOCKING MECHANISM

BACKGROUND OF THE INVENTION

1. Field of the Invention

This invention relates to a new and improved stacked enclosure locking mechanism. More particularly, the invention relates to a module which is sandwiched between a pair of vertically spaced electronic enclosures, such as computers or peripherals. The mechanism is preferably a module secured on top of an underlying enclosure or a base. The superimposed enclosure has at least one foot formed with a substantially horizontal aperture such as slot on the foot. A slide or latch in the module is moveable between a retracted position and a locking position wherein the latch moves into the aperture to secure the superimposed enclosure to the module.

2. Prior Art

Racks and shelving have heretofore been used to secure superimposed enclosures, individual enclosures being supported by corresponding shelves. A feature of the present invention is the elimination of such shelves or racks and the inconvenience of tying the enclosures to the shelves.

Another prior means for stacking enclosures requires the use of external interfitting extruded channels. The present invention achieves the same goal but requires less floor space to accomplish its objective.

SUMMARY OF THE INVENTION

The enclosures used in connection with the present invention have feet depending from the bottom, preferably at four corners. When not stacked, an enclosure rests on the feet. In accordance with the present invention, a horizontally extending groove is formed on a side of at least one such foot. Where the enclosure is intended to support a superimposed enclosure, tapped inserts are provided in the top of the enclosure to secure a lock module thereto.

Sandwiched between two superimposed enclosures or between an underlying base and an enclosure is a lock module. Such a module resembles a shallow tray. On the bottom of the module are pads (e.g., feet) preferably corresponding in position to the feet attached to the bottom of the superimposed enclosure. The use of such pads is optional. Further, spacers such as washers unconnected the superimposed module may be used. In alignment with the enclosure feet are pockets located at the corners to receive the feet of the superimposed enclosure when it is lowered onto the module. A slide in the module moves between a retracted position and a locking position wherein a portion of the slide moves into horizontal grooves in the feet of the upper enclosure to lock the upper enclosure to the lock module. Stops are preferably formed in the module to limit the movement of the latch between retracted and operative positions. The module is secured to the underlying base or underlying enclosure by fasteners fitting through holes in each corner pocket of the module and threaded into tapped inserts in the lower enclosure. Preferably, reinforcing ribs in the module distribute the weight of the upper enclosure and thereby relieve the stress on the feet thereof.

In accordance with the present invention the locked module is attached to the base or to the underlying enclosure by screws fitting into tapped holes in the lower enclosure top cover or into the base. The slide or latch is moved to retracted position so that the corner pockets of the module are clear. The uppermost enclosure is then lowered onto the lock module so that the feet of the uppermost enclosure fit into the lock module pockets. The ribs and sides of the module, rather than the feet, support the tipper enclosure weight. The latch is then slid to operative position so that edges thereof pass into grooves in the upper enclosure feet to secure the upper enclosure to the module; since the module is, in turn, secured to the lower enclosure, the two enclosures are locked together. Fasteners may be used to secure the latch in its operative position to prevent disengagement. By repeating the steps heretofore explained, additional enclosures may be stacked, it being understood that there is a lock module sandwiched between each of the superimposed enclosures.

A feature of the invention is that it permits electronic enclosures to be stacked upon one another in such a way that they are structurally locked together. This allows the enclosures to be transported or be subjected to shock or vibration without concern that they will become disengaged. This feature also permits the stack of enclosures to be mounted on a roll-around unit without fear that the enclosures may slip off when rolled over rough surfaces.

A further feature of the invention is that it does not require external "furniture" such as racks and shelving for stacking the enclosures. This permits the enclosures to occupy a height equal to their actual height plus that of the thin modules as distinguished from the fixed height of permanent shelving or racking. The stack of enclosures occupies no more floor space than a single enclosure. Its cost is less than for a structural shelf system. Air flow through the stacked enclosures is not impeded. The stacked enclosures have a clean, integrated appearance.

The lock module distributes the load of an enclosure across the entire bottom of the enclosure, ensuring that the weight of multiple enclosures on any one enclosure is not concentrated on its feet.

The operations for stacking and locking the enclosures together are from a top down orientation, eliminating awkward manipulation of tools or heavy enclosures. Thus, heretofore it has been required to tip enclosures on their sides in order to attach fittings thereto, an operation which is eliminated in accordance with this invention.

Another feature of the invention is that the locking module is separate from the enclosure so that single, unstacked enclosures are not cost-burdened by the locking mechanism.

Another feature of the invention, as distinguished from the use of fixed shelving, is that enclosures of different heights and functions can be combined in one integrated system.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to those embodiments. On the contrary, the invention is intended to cover alternatives, modifications and equivalents, which may be included within the spirit and scope of the invention as defined by the appended claims.

Figure 1:
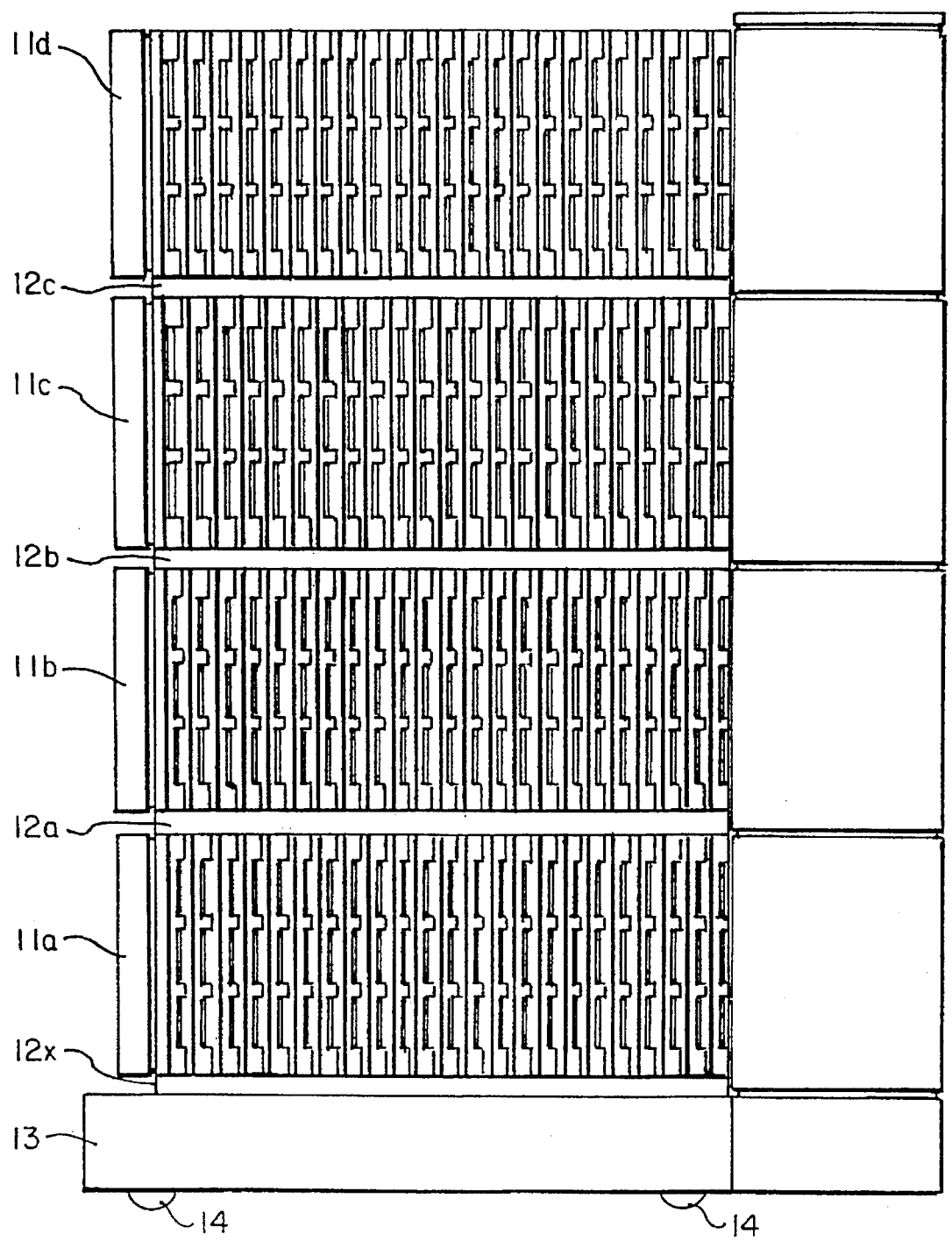
FIG. 1 is a representational side elevational view of a plurality of enclosures joined together by modules in accordance with the present invention stacked on a cart.

Directing attention to FIG. 1, it will be seen that there is a plurality of superimposed enclosures 11a, 11b, 11c and 11d and between each enclosure is a module 12a, 12b, 12c. Supporting the stacked enclosures is a cart 13 having ground wheels 14 and the lowermost enclosure 11a is secured to cart 13 by module 12x. It will be understood that the shapes of the enclosures 11 and the cart 13, as well as the number of superimposed enclosures, is subject to wide variation.

Figure 2:
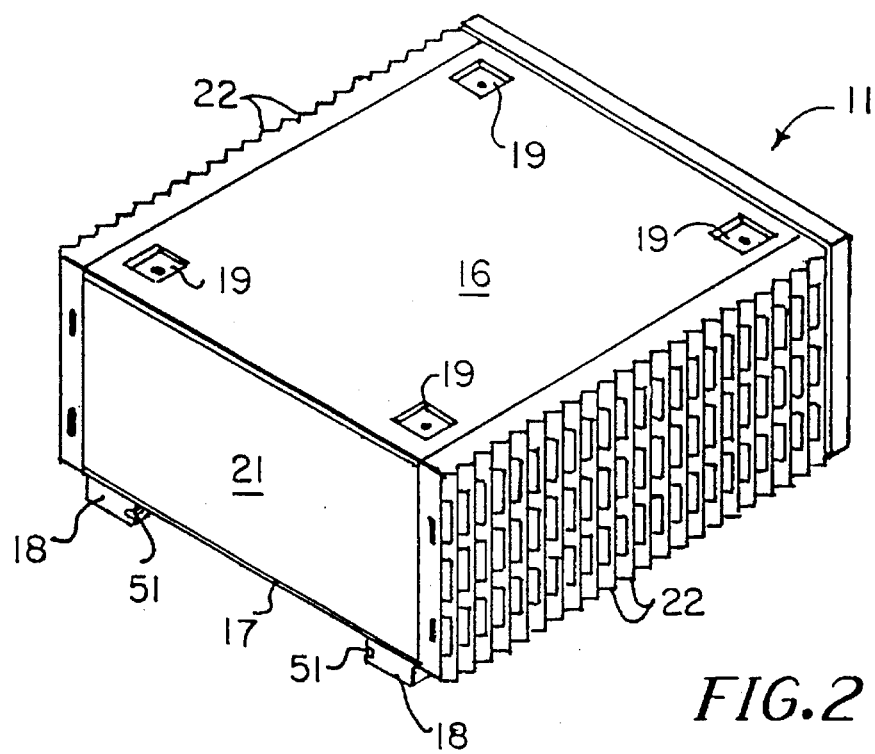
FIG. 2 is a rear perspective view of an enclosure used with the present invention.
Figure 5:
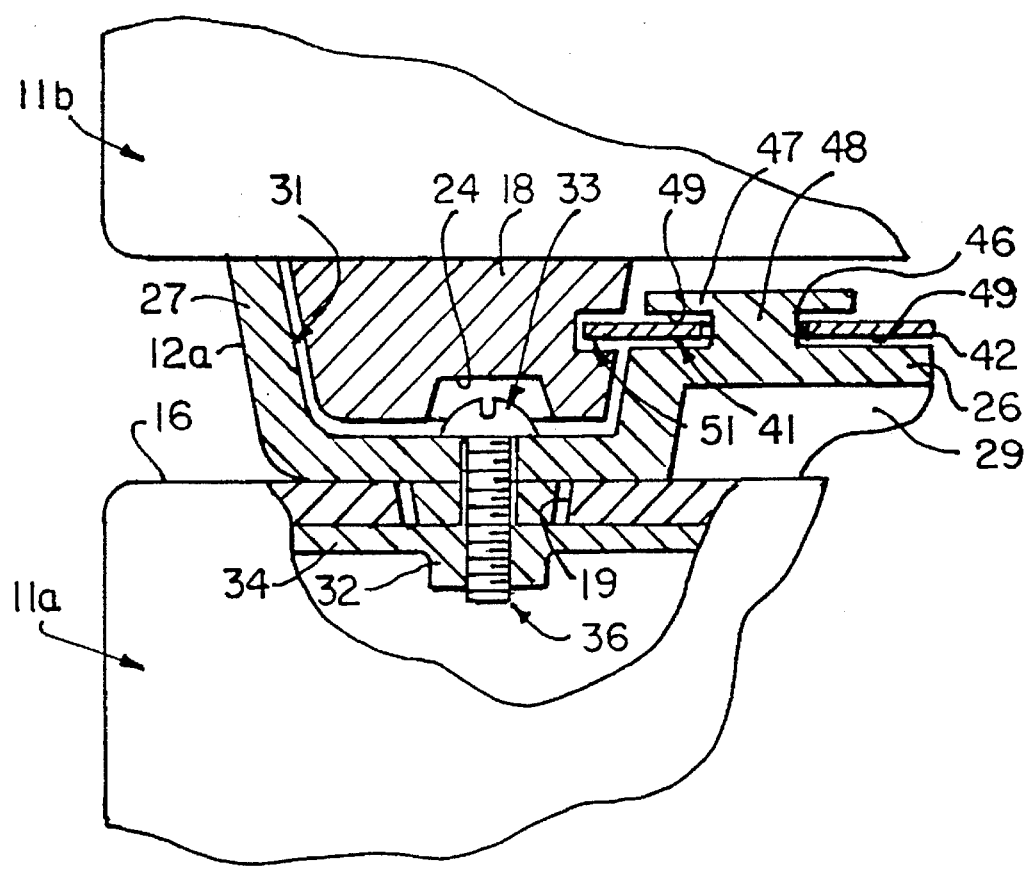
FIG. 5 is an enlarged, fragmentary sectional view through a corner of an underlying enclosure, module and superimposed enclosure.

As best shown in FIG. 2, each enclosure 11 has a casing top 16 and bottom 17 from the four corners of which depend feet 18. The top 16 is preferably formed with footprints 19 which are smaller than the feet 18. Where the particular enclosure 11 is the uppermost of a stack of enclosures, the footprints 19 may be eliminated or concealed. Enclosure 11 has sides 21 and some of sides 21 are provided with ventilation louvers 22. As best shown in FIG. 5, a recess 24 is formed in the bottom of each foot 18.

Module 12 is preferably slightly smaller in width and length than enclosure 11, having a rectangular base 26 on the periphery of which are upstanding edges 27. Longitudinal and transverse reinforcing ribs 28 are formed extending up from base 26 to approximately the elevation of edges 27. In certain areas, shortened reinforcing ribs 29 extend up from base 26 for reasons which hereinafter appear.

As best shown in FIG. 5, a foot pocket 31 is formed in each corner of module 12a and depending from the foot pocket 31 is a module pad 32 which fits into footprint 19 of the top 16 of the casing of enclosure 11a. Pad 32 may be eliminated or it may be replaced by a spacer such as a washer unattached to the module. Pad 32 is apertured for screw 33 which may be threaded into a tapped hole 36 or an insert in the chassis 34 of the underlying enclosure. Such an arrangement is desirable if the casing of the enclosure 11 is of a material such as plastic and the chassis 34 is of metal.

Figure 3:
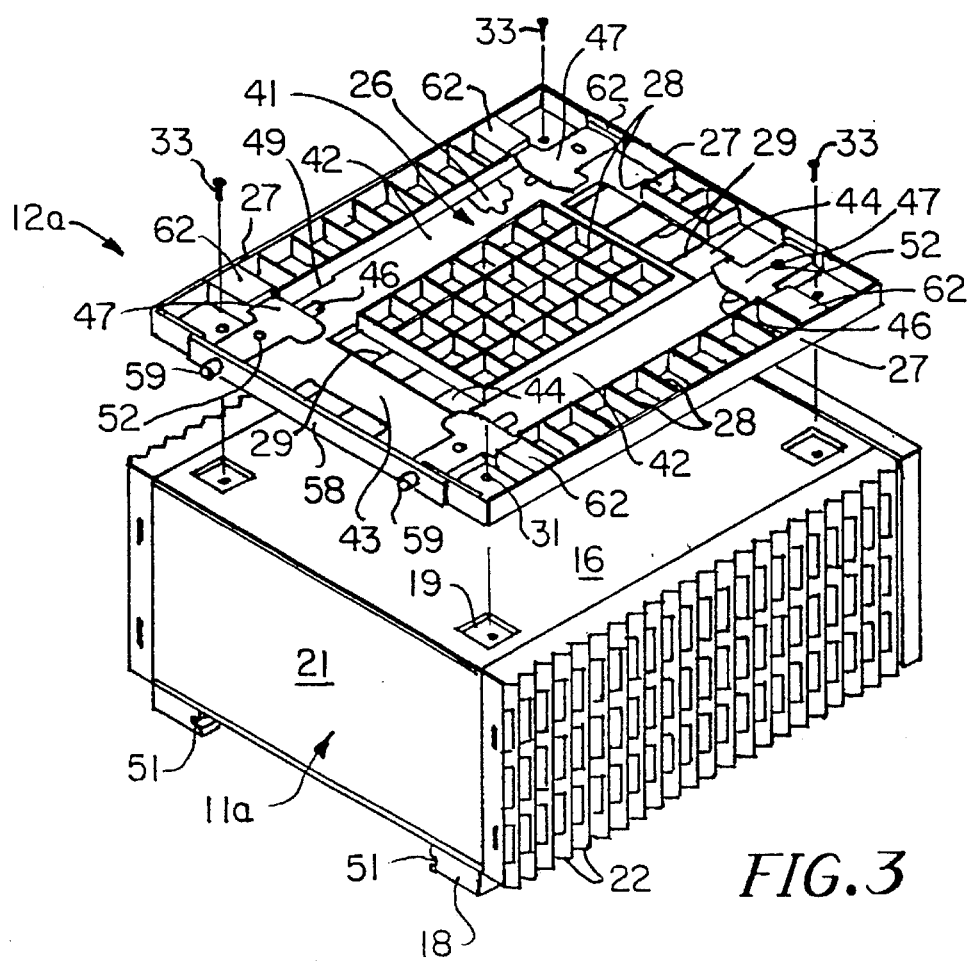
FIG. 3 is a perspective view showing a module positioned above an underlying enclosure.
Figure 4:
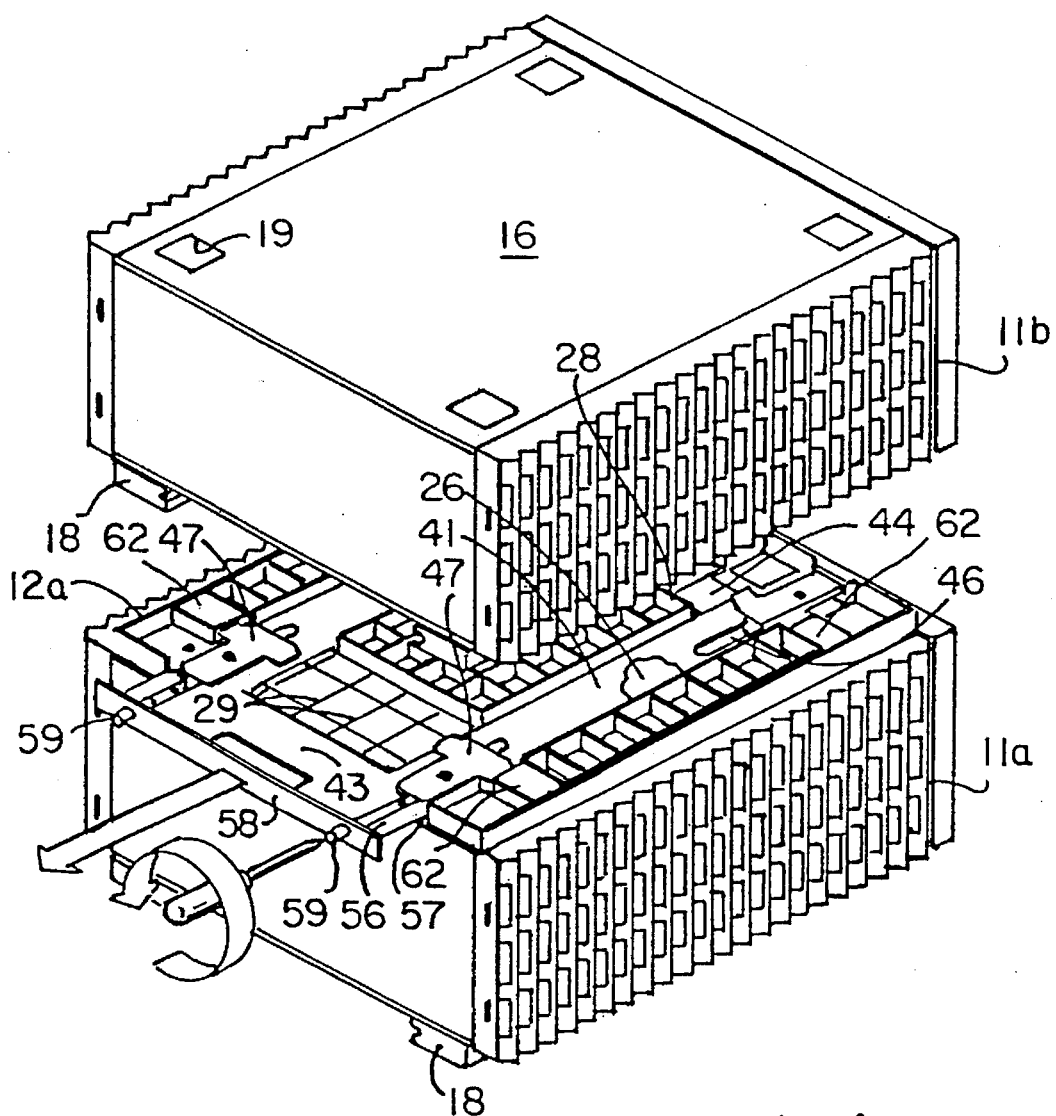
FIG. 4 is a perspective view showing the module attached to the underlying enclosure and a superimposed enclosure in position to be stacked on the module.
Figure 6:
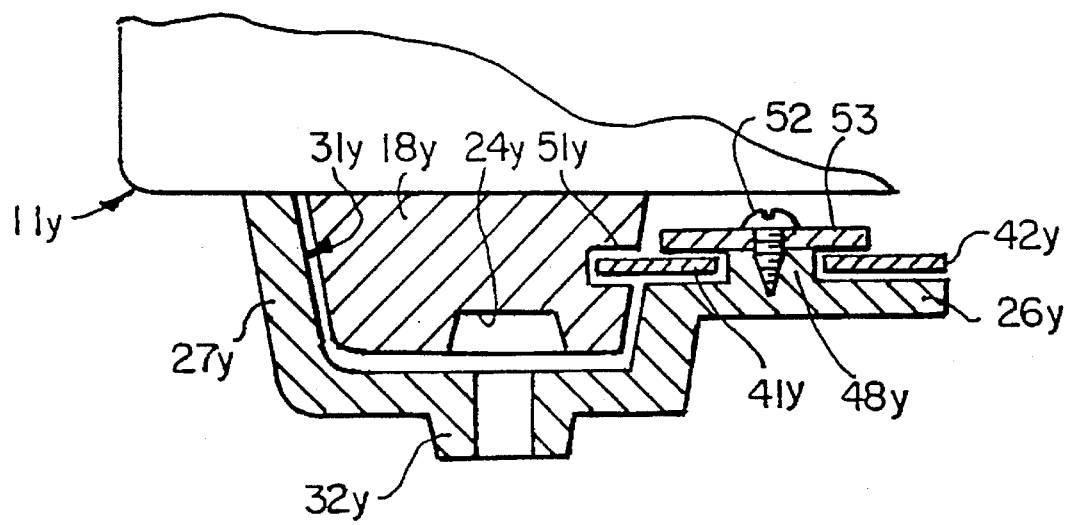
FIG. 6 is an enlarged, fragmentary sectional view of a modification of a portion of FIG. 5.

Slide or latch 41 slides horizontally in module 12 from the retracted position shown in FIG. 4 to the locked position shown in FIGS. 3 and 5. The shape of slide 41 is subject to wide variation. As shown in FIGS. 3 and 4 it comprises longitudinal portions 42 spaced inward from side edges 27 and resting on shortened reinforcing ribs 29. On the left side of FIGS. 3 and 4 the longitudinal portions 42 are interconnected by transverse portion 43. Toward the right side of the module 12a shown in FIG. 3 are inward extending lateral stops 44 which loop slide 41 in line. Longitudinal slots 46 are formed in the longitudinal portions 42 to receive the vertically extending supports 48 of slide holddowns 47. Reliefs 49 are formed at appropriate locations in the outer edges of longitudinal portions 42, the reliefs 49 being opposite feet 18 in the retracted position of the latch. As best shown in FIG. 5, holddowns 47 permit horizontal sliding of slide 41 but restrain vertical movement thereof. Holddowns 47 may be formed integral with supports 48 and with base 26 or, as shown in FIG. 6, the holddowns may be separate members 53 held in place by screws 52 attaching member 53 to support 48. Again referring to FIG. 5, horizontal grooves or apertures 51 are formed in feet 18 so that the edges of slide 41 fit therein when slide 41 is in operative position, thereby locking the superimposed enclosure 11b to the module 12a. When the latch is in retracted position, slide 41 does not extend into slots 51 so that the feet 18 may be lowered into pockets 31 or lifted therefrom.

If the assembly of FIG. 1 is likely to be subjected to vibration or tipping, it may be desirable to secure the slide 41 in operative position. For such purposes, there are extensions 56 of longitudinal portions 42 extending to the left through openings 57 in the left edge 27. The outer ends of extensions 56 are joined by external transverse bar 58 apertured for screws 59.

Inward movement of slide 41 may be limited by bar 58 contacting the left edges of side 27. The retracted movement of slide 41 may be limited by lateral cross-member 44 engaging the rear edge of the extended reinforcing ribs 28 in the center of the module 12 as shown in FIG. 4. Overhangs 62 extending inward from edges 27 engage the top portions of holddowns 47 to limit upward movement thereof.

The enclosures and modules illustrated and herein described are vertically stacked. It will be understood, however, that such orientation is optional. For example, the enclosures could be horizontally adjacent one another. Further, for convenience, the enclosures are shown rectangular and are provided with feet at each of the four corners thereof. The shapes of the enclosures and the number and location of feet are likewise subject to variation. The latch heretofore described slides into a horizontal groove in a foot but it will be understood that the slide may engage other shaped apertures, such as holes extending at least partially into the foot.

The structure of FIG. 6 is in most respects similar to that of FIG. 5 and the same reference numerals, followed by the subscript y are used to designate corresponding parts.

As used in the appended claims, "aperture" means groove 51 as well as holes or other means to engage slide 41.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A module adapted to be sandwiched between an underlying member and a superimposed member wherein said underlying member comprises a first top and at least one fastener receptor in said first top and said superimposed member comprises a first bottom and a foot extending below said first bottom, said foot formed with a substantially horizontal aperture, said module comprising a second top and a second bottom, a pocket in said second top shaped to locate said superimposed member relative to said module, said second top being dimensioned and shaped to rest adjacent said first bottom and said second bottom being dimensioned and shaped to rest adjacent said first top, at least one hole in said second bottom being aligned with said fastener receptor to receive a fastener extending through said hole to removably secure said module to said underlying member, a latch substantially horizontally slidable adjacent said foot, and a guide for said latch for guiding movement between a retracted position and a latching position, wherein a portion of said latch fits snugly in said aperture to secure said superimposed member to said module when said latch is in the latching position.

2. A module according to claim 1 wherein said horizontal aperture comprises a slot formed in said foot, said guide confining movement of said latch so that in latching position an edge of said latch fits in said slot.

3. A module according to claim 1 which further comprises a first and a second stop connected to said second bottom to limit movement of said latch between retracted and latching positions.

4. A module according to claim 1, in which said pocket is shaped to receive said foot.

5. A module according to claim 1 for use with a superimposed member having additional feet extending below said first bottom, at least some of said additional feet being formed with additional apertures, said latch in latching position fitting into at least some of said apertures.

6. A module according to claim 5 in which said latch has first and second outer longitudinal edges, said outer longitudinal edges being formed with reliefs reducing the width of said latch, said edges having wide portions spaced from said reliefs whereby in retracted position of said latch said reliefs are opposite said apertures and in latching position said wider portions fit into at least some of said apertures.

7. A module according to claim 6 in which said apertures comprise horizontal slots slightly wider than said latch edges formed in inside edges of said feet.

8. A module according to claim 6 in which said latch is formed with a pair of longitudinal slots and said guide comprises a pair of holddowns positioned above said latch and each engaging top surfaces of said latch, said holddowns each having connecting portions joined to said second bottom and passing through one said slot.

9. A module according to claim 8 in which said holddowns are discrete from said guide and which further comprises screws to secure said holddowns to said guides.

10. A module according to claim 9 in which said second bottom is formed with upstanding reinforcing ribs, said latch sliding on some of said ribs.

11. A module according to claim 10 in which said second bottom is forming with second reinforcing ribs higher than said first-mentioned ribs, said second reinforcing ribs contacting said first bottom to support at least a substantial portion of the weight of said superimposed member.

12. A module according to claim 11 in which said module is formed with peripheral edges upstanding from said bottom, said peripheral edges having substantially the same elevation as said second reinforcing ribs.

13. In combination,
an underlying member,
a superimposed member,
a module between said underlying member and said superimposed member, said underlying member comprising a first top and at least one fastener receptor in said first top and said superimposed member comprising a first bottom and a foot extending below said first bottom, said foot being formed with a substantially horizontal aperture, said module comprising a second top and a second bottom, said module being shaped to receive said first bottom, said second bottom resting on said first top, at least one hole in said second bottom aligned with said fastener receptor, a fastener extending through said hole securing said module to said underlying member, a latch substantially horizontally slidable adjacent said foot and a guide for guiding said latch for movement between a retracted position and a latching position wherein a portion of said latch fits snugly in said aperture to secure said superimposed member to said module.

14. The combination of claim 13 in which said underlying member is an enclosure for a component.

15. The combination of claim 13 in which said underlying member is a base.

16. The combination of claim 15 in which said base has rollers.

17. A combination of claim 13 wherein said horizontal aperture comprises a slot formed in said foot, said guide confining movement of said latch so that in latching position an edge of said latch fits in said slot.

18. The combination of claim 13 which further comprises a first and a second stop connected to said second bottom to limit movement of said latch between retracted and latching positions.

19. The combination of claim 13 in which said module is formed with a pocket shaped to receive said foot.

20. The combination of claim 13 wherein said superimposed member has additional feet extending below said first bottom, at least some of said additional feet being formed with additional apertures, said latch in latching position fitting into at least some of said additional apertures.

21. The combination of claim 20 in which said latch has first and second outer longitudinal edges, said outer longitudinal edges being formed with reliefs reducing the width of said latch, said edges having wide portions spaced from said reliefs whereby in retracted position of said latch said reliefs are opposite said apertures and in latching position said wider portions fit into at least some of said apertures.

22. The combination of claim 21 in which said apertures comprise horizontal slots formed in inside edges of said feet slightly wider than said latch edges.

23. The combination of claim 21 in which said latch is formed with a pair of longitudinal slots and said guide comprises a pair of holddowns positioned above said latch and each engaging top surfaces of said latch, said holddowns each having connecting portions joined to said second bottom and passing through one said slot.

24. The combination of claim 23 in which said holddowns are discrete from said guide and are formed with slots and which further comprises screws extending through said slots and engaging said base to secure said holddowns to said guides.

25. The combination of claim 24 in which said second bottom is formed with upstanding reinforcing ribs, said latch sliding on some of said ribs.

26. The combination of claim 25 in which said second bottom is forming with second reinforcing ribs higher than said first mentioned ribs, said second reinforcing ribs contacting said first bottom to support at least a substantial portion of the weight of said superimposed portion.

27. The combination of claim 26 in which said module is formed with peripheral edges upstanding from said bottom, said peripheral edges having substantially the same elevation as said second reinforcing ribs.

28. The combination of claim 13 in which said module is formed with a pocket shaped to receive said foot, said latch slidable in proximity of said pocket.

* * * * *